(12) United States Patent
Yokoyama et al.

(10) Patent No.: US 7,498,717 B2
(45) Date of Patent: Mar. 3, 2009

(54) RESONATOR, FILTER AND FABRICATION OF RESONATOR

(75) Inventors: Tsuyoshi Yokoyama, Kawasaki (JP);
Tokihiro Nishihara, Kawasaki (JP);
Takeshi Sakashita, Kawasaki (JP);
Shinji Taniguchi, Kawasaki (JP);
Masafumi Iwaki, Kawasaki (JP);
Masanori Ueda, Yokohama (JP);
Tsutomu Miyashita, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 6 days.

(21) Appl. No.: 11/092,979

(22) Filed: Mar. 30, 2005

(65) Prior Publication Data

US 2005/0218754 A1 Oct. 6, 2005

(30) Foreign Application Priority Data

Mar. 31, 2004 (JP) .............................. 2004-101878

(51) Int. Cl.
*H01L 41/09* (2006.01)
(52) U.S. Cl. ...................................... 310/320
(58) Field of Classification Search ................. 310/311, 310/324, 330, 334, 320, 321, 365–366; 333/189–199
See application file for complete search history.

(56) References Cited

U.S. PATENT DOCUMENTS

| | | | |
|---|---|---|---|
| 5,894,647 A | | 4/1999 | Lakin |
| 5,910,756 A | * | 6/1999 | Ella .......................... 333/133 |
| 5,942,958 A | * | 8/1999 | Lakin ......................... 333/189 |
| 6,262,637 B1 | * | 7/2001 | Bradley et al. ............... 310/366 |
| 6,307,447 B1 | | 10/2001 | Barber et al. |
| 6,339,276 B1 | | 1/2002 | Barber et al. |
| 7,199,504 B2 | * | 4/2007 | Komuro et al. ............. 310/320 |
| 2002/0123177 A1 | | 9/2002 | Ruby et al. |
| 2003/0186673 A1 | | 10/2003 | Kimachi et al. |

(Continued)

FOREIGN PATENT DOCUMENTS

EP WO 0191289 * 11/2001

(Continued)

OTHER PUBLICATIONS

Kenneth M. Lakin, et al., "Development of Miniature Filters For Wireless Application", IEEE Transactions on Microwave Theory and Techniques, IEEE Inc., New York, vol. 43, No. 12 Part 2, pp. 2933-2939.

*Primary Examiner*—Thomas M Dougherty
*Assistant Examiner*—Karen B Addison
(74) *Attorney, Agent, or Firm*—Arent Fox LLP

(57) ABSTRACT

A resonator includes a piezoelectric thin-film provided on a main surface of a substrate, a first electrode film provided on a first surface of the piezoelectric thin-film, a second electrode film provided on a second surface of the piezoelectric thin-film, a frequency adjustment film provided on one of the first and second electrode films, the frequency adjustment film comprising a film laminate including a first adjustment film provided on said one of the first and second electrode films, and a second adjustment film provided on the first adjustment film. The first adjustment film is used for Δf adjustment, and the second adjustment film is used for correcting frequency deviations generated in the filter manufacturing process. Thus, it is possible to accurately control the center frequency of the filter in which the multiple resonators are connected.

4 Claims, 17 Drawing Sheets

U.S. PATENT DOCUMENTS

2004/0021191 A1  2/2004  Bradley

FOREIGN PATENT DOCUMENTS

| EP | 1225695 | * | 12/2001 |
| EP | 1 225 695 A2 | | 7/2002 |
| EP | 1225695 | * | 7/2002 |
| EP | 1 306 973 A2 | | 5/2003 |
| JP | 11-284480 A | | 10/1999 |
| JP | 2001-326553 A | | 11/2001 |
| JP | 2002-335141 | | 11/2002 |
| JP | 2002-359539 | | 12/2002 |
| JP | 2003-037469 A | | 2/2003 |
| KR | 2003-0027430 A | | 4/2003 |
| WO | 01/91289 A1 | | 11/2001 |

* cited by examiner

RESONATOR, FILTER AND FABRICATION OF RESONATOR

BACKGROUND OF THE INVENTION

1. Field of the Invention

This invention generally relates to resonators, filters, and methods of fabricating the resonator and more particularly, to a piezoelectric resonator, a high-frequency filter having the piezoelectric resonator, and a method of fabricating the resonator. Specifically, the present invention relates to an adjustment technique of a resonant frequency.

2. Description of the Related Art

As radio communication devices such as mobile telephones have been rapidly spreading, a filter composed of small-sized and lightweight resonators and a combination of the aforementioned resonators has been increasingly demanded. So far, with the use of a surface acoustic wave (hereinafter referred to as SAW) generated on a surface of a piezoelectric substance, a SAW resonator, which is a piezoelectric element, or a SAW filter having the SAW resonator has been used for filtering a certain resonant frequency component as an electric signal. These days, a piezoelectric thin-film resonator and the filter having the piezoelectric thin-film resonator are increasingly gaining attention, because the piezoelectric thin-film resonator has excellent high-frequency characteristics, and is also capable of being downsized and having a monolithic structure.

The above-mentioned piezoelectric thin-film resonators are categorized into two types, FBAR (Film Bulk Acoustic Resonator) and SMR (Solidly Mounted Resonator). The FBAR includes a laminated structure of an upper electrode film, a piezoelectric film, and a lower electrode film, which are laminated on a substrate such as silicon or glass. A hole or cavity is provided immediately below the lower electrode film facing the upper electrode film so as to confine an elastic energy. This hole is formed by wet etching a sacrifice layer provided on a substrate surface or wet or dry etching from a backside of the silicon substrate. On the other hand, the SMR has a structure of acoustic reflection film, instead of the above-mentioned hole, in which a high acoustic impedance film and a low acoustic impedance film are alternately laminated with a film thickness of $\lambda/4$ where $\lambda$ is a wavelength of an acoustic wave.

Aluminum (Al), copper (Cu), molybdenum (Mo), tungsten (W), tantalum (Ta), platinum (Pt), ruthenium (Ru), rhodium (Rh), and iridium (Ir) may be used for the electrode film in the piezoelectric thin-film resonator. Aluminium nitride (AlN), zinc oxide (ZnO), lead zirconate titanate (PZT), and lead titanate ($PbTiO_3$) may be used for the piezoelectric film.

A high-frequency voltage is applied between the upper electrode and the lower electrode in the piezoelectric thin-film resonator as an electric signal, and then an acoustic wave is excited due to an inverse piezoelectric effect in the piezoelectric film arranged between the upper electrode and the lower electrode. A deviation generated by the acoustic wave is converted into an electric signal due to the piezoelectric effect. This acoustic wave is completely reflected on surfaces of the upper electrode film and the lower electrode film, the surfaces respectively contacting with air. The acoustic wave is a longitudinal mode thickness excitation having a main displacement in a direction of thickness of the piezoelectric film. The resonator or filter having desired frequency characteristics is obtainable by utilizing the above-mentioned resonance effects.

On an FBAR-type piezoelectric thin-film resonator, for example, the resonance occurs at a frequency of $H=n\lambda/2$, where H denotes a total thickness of the laminated structure having main components of the upper electrode film, the piezoelectric film, and the lower electrode film, which are formed on the hole, and $\lambda$ denotes a wavelength of the acoustic wave. Therefore, $n\lambda/2$ denotes integral multiplication (n times) of a half of the wavelength $\lambda$. Here, in the case where V is set to a propagation velocity of the acoustic wave determined by a piezoelectric film substance, a resonance frequency $F=nV/(2H)$. The resonance frequency F can be controlled by the total thickness H of the laminated structure.

In the case where the filter is designed by arranging multiple piezoelectric thin-film resonators described above, the following points are essential. First, the resonance frequencies of the multiple piezoelectric thin-film resonators arranged on a single substrate or wafer have to be slightly different from one another, generally several percent. The adjustment for realizing the above-mentioned resonance frequencies is called a $\Delta f$ adjustment process. Now, a first resonator is defined as a resonator in which the resonance frequency thereof is changed in the $\Delta f$ adjustment process, and a second resonator is defined as a resonator in which the resonance frequency thereof is not changed in the $\Delta f$ adjustment process. Second, a center frequency of the filter has to be adjusted accurately by controlling the frequencies of the above-mentioned resonators. For example, the filter composed of multiple first and second resonators may have a deviation of the center frequency from the design value due to the degree of accuracy of forming the laminated structure of the thin film. Therefore, the center frequency of the filter has to be adjusted to the design value.

As described above, the highly accurate filter with the multiple piezoelectric thin-film resonators requires the resonance frequencies to be adjusted at least twice.

As described above, the piezoelectric thin-film resonator or the filter having the piezoelectric thin-film resonators should be fabricated taking the following into consideration. First, the first and second resonators should be fabricated on a single substrate or wafer, and the resonance frequency of each of the first resonators should be adjusted accurately in the $\Delta f$ adjustment process. Second, the center frequency of the filter with the multiple first and second resonators should be accurately adjusted.

It is well known that the resonance frequency of the resonator is inversely proportional to the thickness (weight) of the thin-film laminated structure. That is to say, the thicker (the heavier) the thin-film laminated structure becomes, the resonance frequency tends to be lower. The thinner (the lighter) the thin-film laminated structure becomes, the resonance frequency tends to be higher.

Conventionally, the following methods are well known as the $\Delta f$ adjustment methods so that the multiple resonators having different resonance frequencies may be fabricated on a single substrate.

A first method is described in Japanese Patent Application Publication No. 2002-335141 referred to as Document 1). The adjustment is performed by making the upper electrode thin and shifting the resonance frequency to be higher. However, this method has a problem in that the electrode surface gets activated in making the thin-film electrode, is chemically reacted with oxygen in the presence, and is oxidized. It is thus difficult to obtain the stable resonance characteristics. The upper electrodes of the first and second resonators have different surface states after the $\Delta f$ adjustment process. This prevents the resonance frequencies of the first and second resonators from being adjusted uniformly, and makes it difficult to adjust the center frequency stably while maintaining the filter characteristics.

A second method is described in Japanese Patent Application Publication No. 2002-359539 (hereinafter referred to as Document 2). The frequency is adjusted by oxidizing the surface of the upper electrode. The second method, as in the first method, it is difficult to evenly oxidize the upper electrodes having different surface states. It is thus difficult to adjust the center frequency stably.

A third method is described in U.S. Pat. No. 5,894,647 (hereinafter referred to as Document 3). The adjustment is performed by making the upper electrode thick and shifting the resonance frequency to be lower. However, this method requires a substrate or wafer to be taken out from vacuum equipment once for partially providing a new layer on the single substrate. At this time, an oxidized film is naturally formed on the upper electrode film. This naturally oxidized film has a bad film adhesion to the above-mentioned newly added film. There is a problem in that it is hard to obtain excellent resonance characteristics and realize the highly accurate adjustment. Additionally, only some of the multiple resonators formed on the single substrate are required to have thick upper electrode films. However, this needs an increased number of fabrication steps and raises production cost.

As described above, any one of the conventional Δf adjustment methods is not sufficient for adjusting the resonance frequency of the resonators and the center frequency of the filter.

SUMMARY OF THE INVENTION

The present invention has been made in view of the above-mentioned circumstances and a general object thereof is to provide a method for enabling accurate Δf adjustment of multiple piezoelectric thin-film resonators fabricated on a single substrate or wafer and accurately adjusting a center frequency of a filter having the multiple piezoelectric thin-film resonators.

According to one aspect of the present invention, preferably, there is provided a resonator including a piezoelectric thin-film provided on a main surface of a substrate, a first electrode film provided on a first surface of the piezoelectric thin-film, a second electrode film provided on a second surface of the piezoelectric thin-film, a frequency adjustment film provided on one of the first and second electrode films, the frequency adjustment film comprising a film laminate including a first adjustment film provided on said one of the first and second electrode films, and a second adjustment film provided on the first adjustment film.

According to another aspect of the present invention, there is provided a method of fabricating a resonator comprising: forming a first electrode film on a first surface of the piezoelectric thin-film on a main surface of a substrate, a second electrode film on a second surface of the piezoelectric thin-film, and a frequency adjustment film on one of the first and second electrode films; and adjusting a thickness of a portion of the frequency adjustment film to adjust a resonance frequency of the piezoelectric thin-film.

According to yet another aspect of the present invention, there is provided a method of fabricating a resonator comprising: forming a first electrode film on a first surface of the piezoelectric thin-film on a main surface of a substrate, a second electrode film on a second surface of the piezoelectric thin-film, and a first frequency adjustment film on one of the first and second electrode films; adjusting a thickness of a portion of the first frequency adjustment film to adjust a first resonance frequency of the piezoelectric thin-film; forming a second frequency adjustment film on the first frequency adjustment film; and adjusting a thickness of a region of the second frequency adjustment film to adjust a second resonance frequency of the piezoelectric thin-film.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1A:
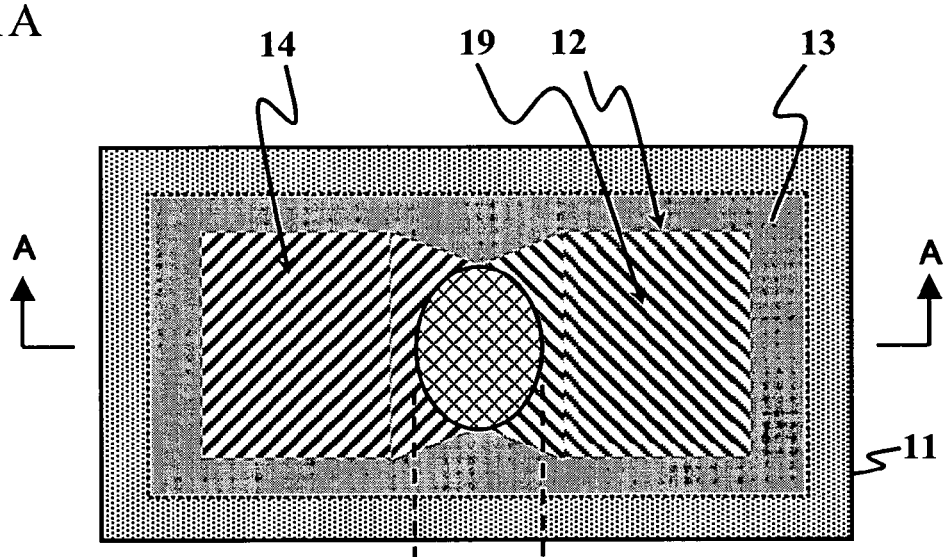
FIGS. 1A through 1C illustrate a piezoelectric thin-film resonator in accordance with a first embodiment of the present invention.
Figure 1B:
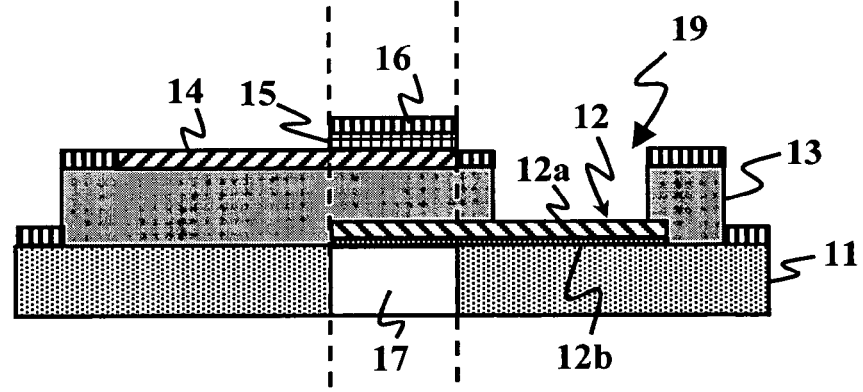
Figure 1C:
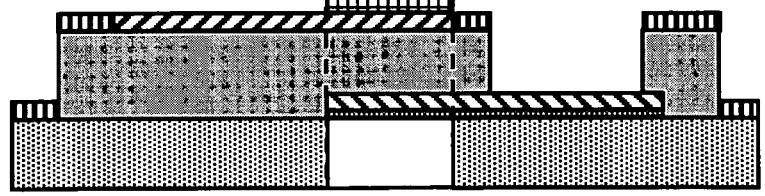

FIGS. 1A through 1C illustrate a piezoelectric thin-film resonator in accordance with a first embodiment of the present invention. FIG. 1A is a top view. FIGS. 1B and 1C are cross-sectional views taken along a line A-A shown in FIG. 1A. The piezoelectric thin-film resonator shown in FIGS. 1A through 1C may be used as a series-arm resonator or a parallel-arm resonator of a filter having a ladder structure.

The piezoelectric thin-film resonator includes a substrate 11 of a silicon substrate, a lower electrode film 12, a piezoelectric film 13 of AlN, and an upper electrode film 14 of Ru. The lower electrode film 12 is a two-layered structure (Ru/Cr) in which a Ru film 12a and a Cr film 12b are laminated. A first adjustment film 15 is provided on the upper electrode film 14. A second adjustment film 16 of $SiO_2$ is provided on the first adjustment film 15. The second adjustment film 16 of $SiO_2$ is also provided on the substrate 11 and the piezoelectric film 13, which are not covered with the lower electrode film 12 and the upper electrode film 14. The first adjustment film 15 and the second adjustment film 16 are provided for adjusting the frequency. The second adjustment film 16 is made of $SiO_2$, but is not limited to $SiO_2$. A material that is hard to be oxidized may be employed in the second adjustment film 16 such as a metal oxide other than $SiO_2$ or a metal nitride such as SiN, AlN, or the like. The lower electrode film 12 is exposed via a contact window 19, which is provided in the piezoelectric film 13.

A hole 17 is formed from the backside of the substrate 11, and penetrates through the substrate 11. The hole 17 serves as a cavity for confining the elastic energy, and approximately corresponds to a region in which the upper electrode film 14 overlaps with the lower electrode film 12. The cavity 17 is formed by etching the silicon substrate from the backside thereof with a fluorinated gas. An upper opening of the cavity 17 is covered with the first adjustment film 15 and the second adjustment film 16. In other words, the first adjustment film 15 and the second adjustment film 16 are provided to cover the whole upper opening of the cavity 17. The first adjustment film 15 and the second adjustment film 16 are also provided on a part of the surface of the upper electrode 14. Other embodiments that will be described layer have cavities similar to the cavity 17 and provided in the same manner as mentioned above.

For example, the piezoelectric thin-film resonator having a frequency of 5.2 GHz has the lower electrode film 12a of Ru having a thickness of 100 nm, the Cr film 12b having a thickness of 50 nm, the piezoelectric film 13 of AlN having a thickness of 400 nm, and the upper electrode film 14 of Ru having a thickness of 100 nm.

A description will now be given of a ladder-type filter in which the resonators are arranged in series and parallel arms. The following ladder-type filter employs FBAR-type resonators.

Figure 2A:
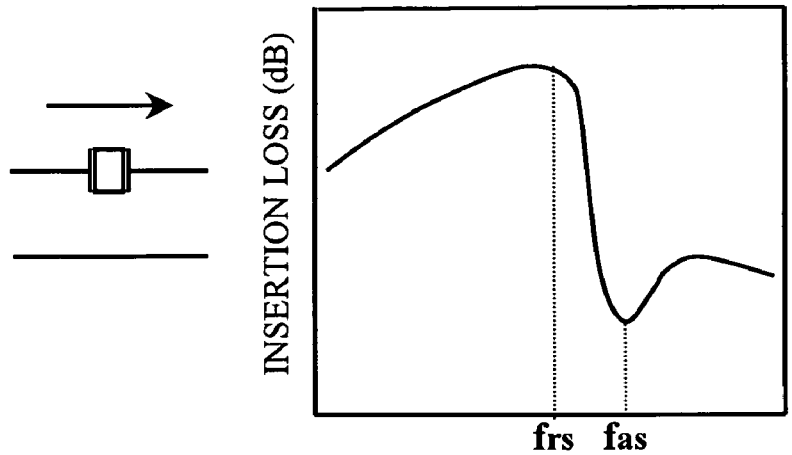
FIGS. 2A through 2C are graphs showing passband characteristics of the filter.
Figure 2B:
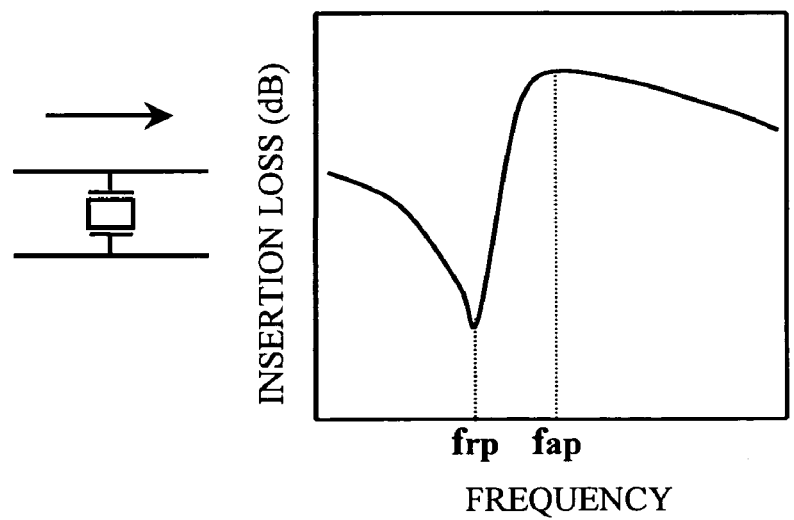
Figure 2C:
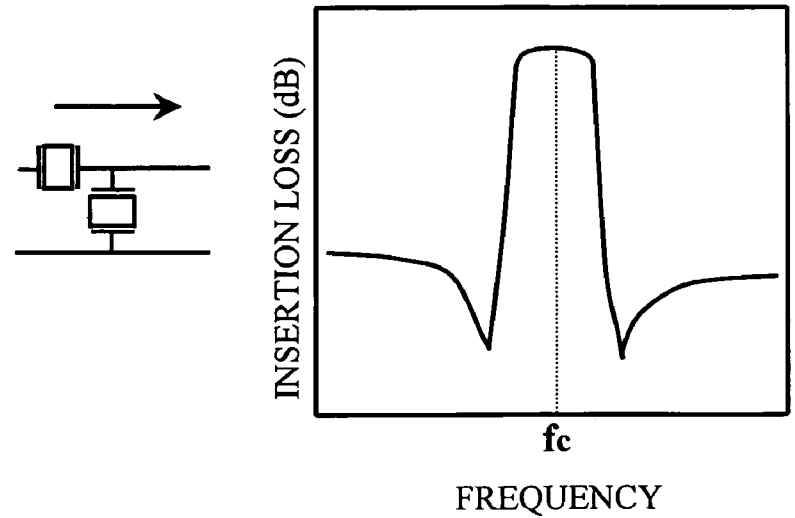

FIGS. 2A through 2C are graphs of passband characteristics of filters. More particularly, FIG. 2A is a graph of the passband characteristics of a filter having a single parallel-arm FBAR. FIG. 2B is a graph of the passband characteristics of another filter having a single series-arm FBAR. FIG. 2C is a graph showing the passband characteristics of yet another filter in which two FBARs are arranged in a single series arm and a single parallel arm.

Referring to FIGS. 2A through 2C, the FBAR has double resonance characteristics including the resonance frequency and antiresonance frequency. As shown in FIG. 2A, the smallest insertion loss is observed at the resonance frequency frs, and the largest insertion loss is observed at the antiresonance frequency fas when the filter has one series-arm FBAR. As shown in FIG. 2B, the largest insertion loss is observed at the resonance frequency frp, and the smallest insertion loss is observed at the antiresonance frequency fap when the filter has one parallel-arm FBAR. As shown in FIG. 2C, when the resonance frequency frs of the series-arm FBAR is nearly equal to the resonance frequency fap of the parallel-arm FBAR, the filter functions as a bandpass filter having the center frequency fc. Desired filter characteristics are obtainable by optimizing the resonance characteristics of the series-arm and parallel-arm resonators and the combination thereof arranged in the ladder structure shown in FIG. 2C.

Figure 3A:
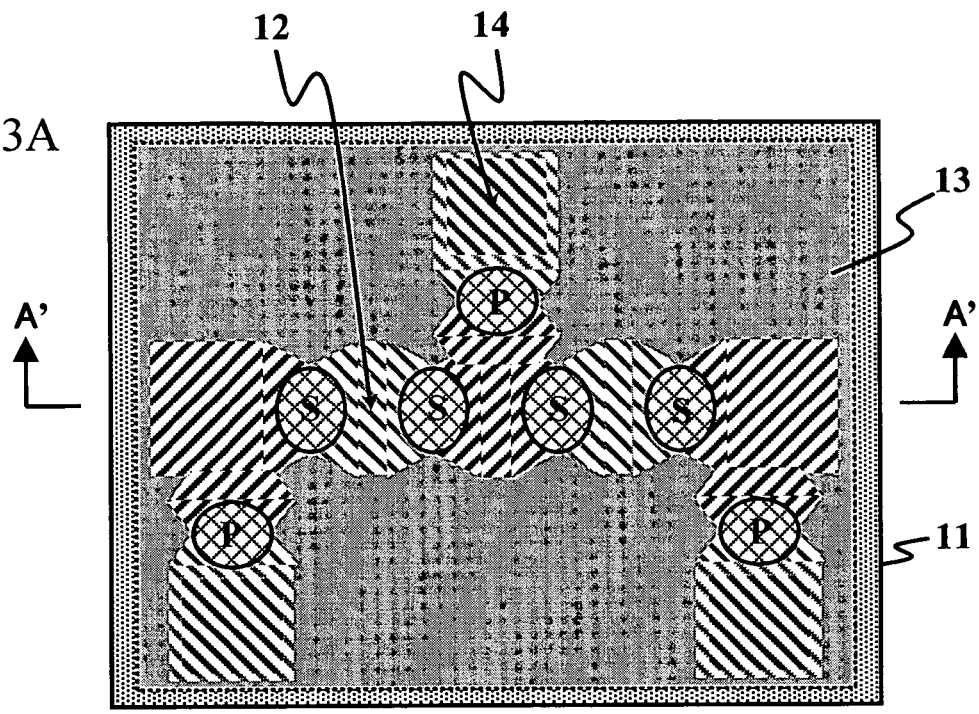
FIGS. 3A through 3C illustrate a filter in which multiple piezoelectric thin-film resonators are connected in both series-arm and parallel-arm in accordance with the present invention.
Figure 3B:
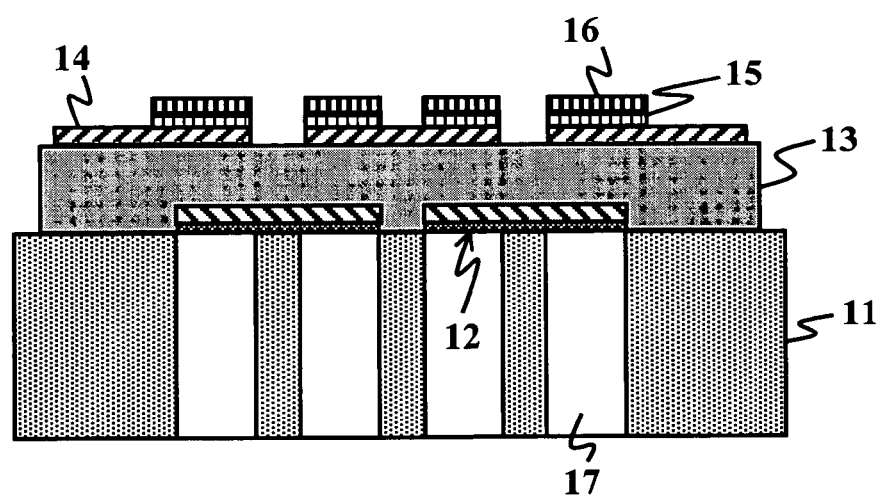
Figure 3C:
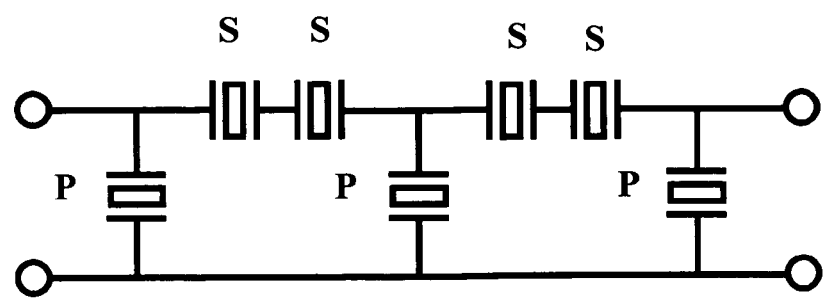

FIGS. 3A through 3C illustrate a filter in which multiple piezoelectric thin-film resonators each configured as mentioned before are arranged in series arms and parallel arms. FIG. 3A is a top view of the filter, and FIG. 3B is a cross-sectional view taken along a line A'-A' shown in FIG. 3A. FIG. 3C is a circuit diagram of the filter shown in FIG. 3A. Referring to FIGS. 3A though 3C, the filter is made up of four series-arm resonators (S) and three parallel-arm resonators (P). The piezoelectric thin-film resonators have a fundamental structure that is almost the same as that shown in FIGS. 1A through 1C. The filter that functions as a bandpass filter with the FBARs is required to have the parallel-arm resonators having reduced resonance frequencies, which are realized by an arrangement in which the first adjustment films 15 of the series-arm resonators are thinner than those of the parallel-arm resonators.

Figure 4A:
FIGS. 4A through 4E illustrate manufacturing processes of the resonator and filter in accordance with the first embodiment of the present invention.
Figure 4B:
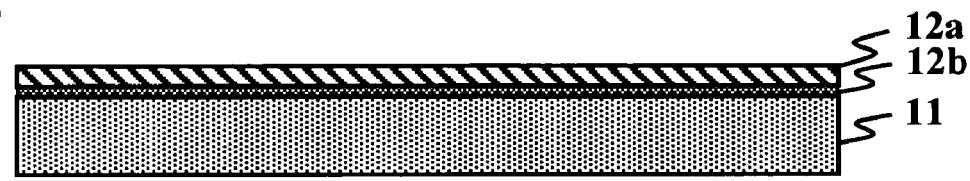
Figure 4C:
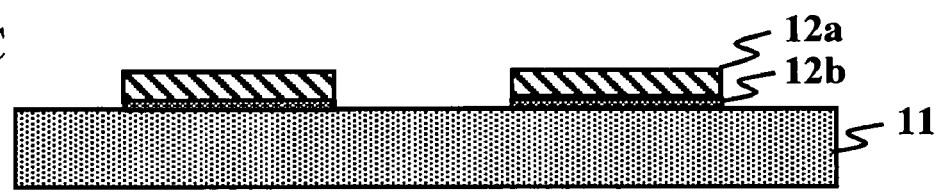
Figure 4D:
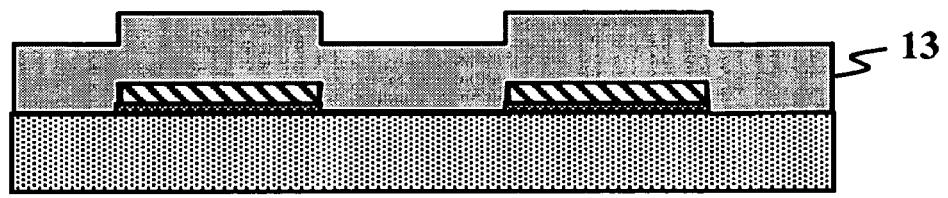
Figure 4E:
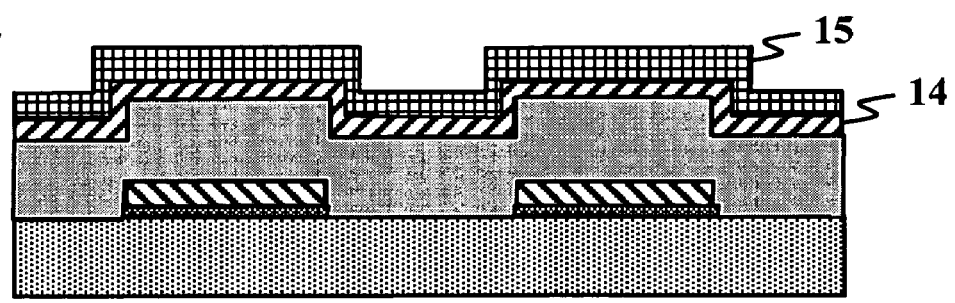

A description will now be given of a process of fabricating the filter with reference to FIGS. 4A through 4E, FIGS. 5A through 5D, and FIGS. 6A through 6D. First, referring to FIGS. 4A and 4B, a film laminate composed of the Ru film 12a and the Cr film 12b is provided, as the lower electrode film 12, on the silicon substrate 11 having a thickness of 300 μm by sputtering. Then, as shown in FIG. 4C, the lower electrode film 12 is patterned into a desired shape with the photolithography and etching (wet or dry) technique. As shown in FIG. 4D, an AlN thin film serving as the piezoelectric film 13 is grown. As shown in FIG. 4E, a Ru film for the upper electrode film 14 and a Ti film for the first adjustment film 15 are grown in turn by sputtering.

Figure 5A:
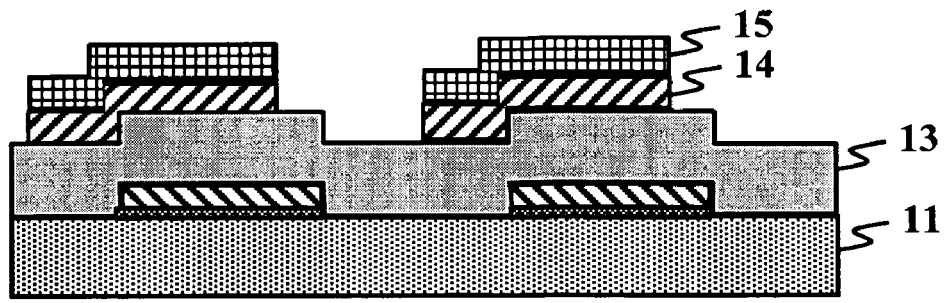
FIGS. 5A through 5D illustrate manufacturing processes of the resonator and filter in accordance with the first embodiment of the present invention.

Next, referring to FIG. 5A, the first adjustment film 15 and the upper electrode film 14 are patterned into desired shapes by the photolithography and wet or dry etching techniques. The first adjustment film 15 and the upper electrode film 14 may be patterned by lift-off.

Figure 5B:
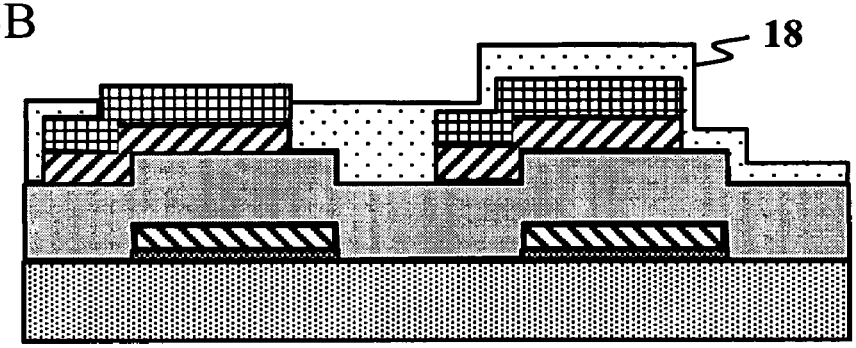
Figure 5C:
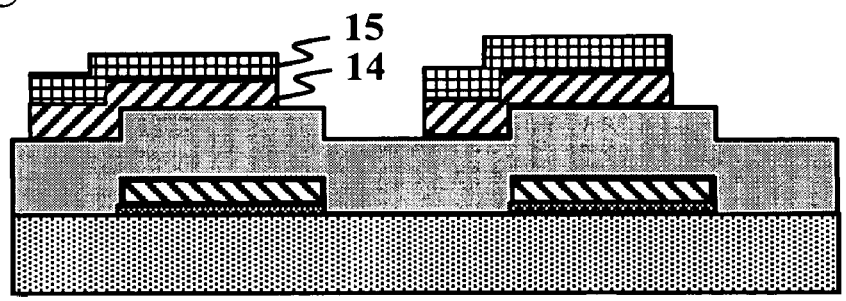

As shown in FIG. 5B, the first adjustment film 15 is partially masked with a resist 18 by the photolithography technique. As shown in FIG. 5C, the first adjustment film 15 is partially dry etched so as to be thinner in order to adjust the weight of the first adjustment film 15. Then, the resist 18 is removed. The process of patterning the first adjustment film 15 and the upper electrode film 14 and the process of partly reducing the thickness of the first adjustment film 15 may be performed in reverse order from the order described above.

Figure 5D:
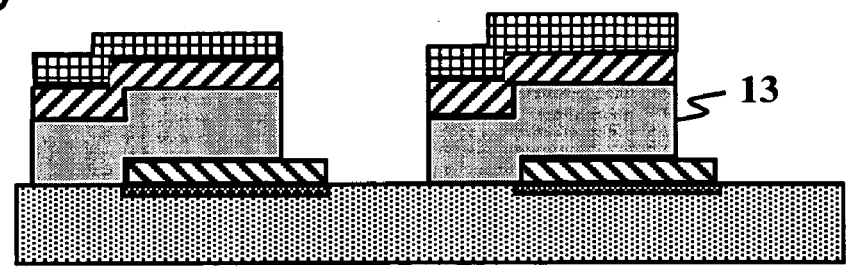
Figure 6A:
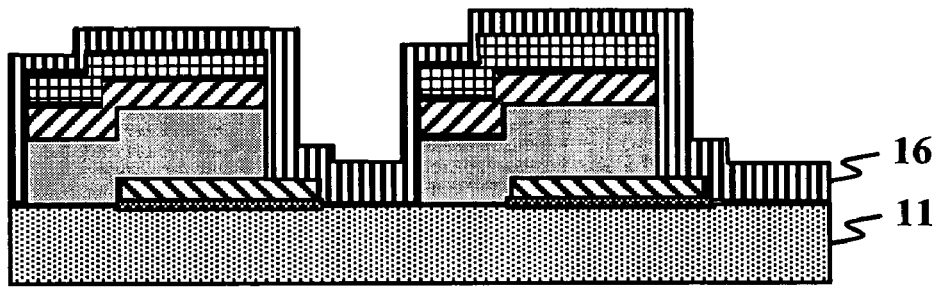
FIGS. 6A through 6D illustrate manufacturing processes of the resonator and filter in accordance with the first embodiment of the present invention.
Figure 6B:
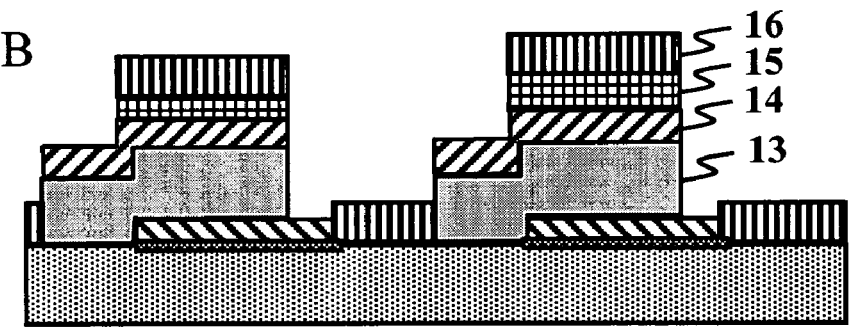

Next, as shown in FIG. 5D, the piezoelectric film 13 is patterned into a desired shape by the photolithography and wet or dry etching techniques. Then, as shown in FIGS. 6A and 6B, the second adjustment film 16 of $SiO_2$ is grown by sputtering, and unnecessary parts of the first adjustment film 15 and the second adjustment film 16 provided on the upper electrode film 14 are removed so that bump pads, not shown, may be formed thereon.

Figure 6C:
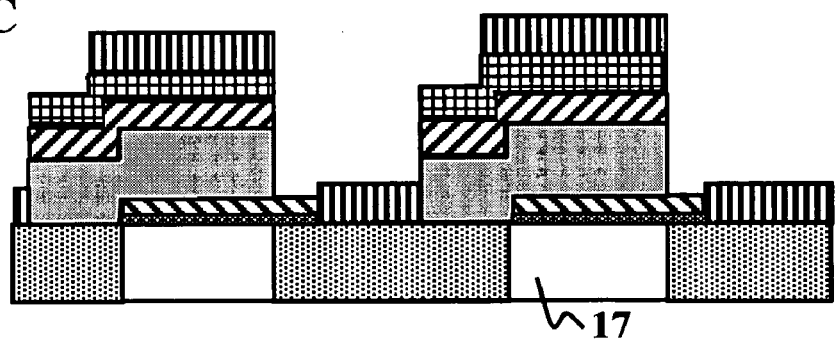
Figure 6D:
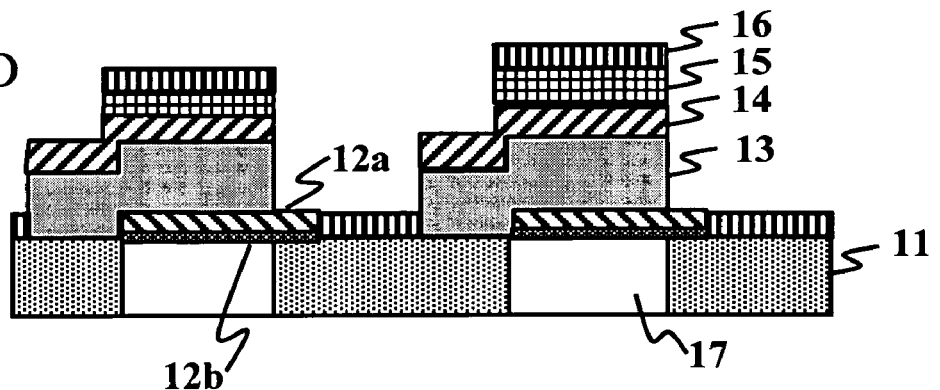

Finally, referring to FIG. 6C, the resist for dry etching is patterned on the backside of the silicon substrate 11 with the photolithography technique in order to form the cavity 17. The cavity 17 is arranged on the backside of the substrate 11 so as to correspond the overlapping region in which the upper electrode film 14 and the lower electrode film 12 face. In the above-mentioned manner, as shown in FIG. 6D, the piezoelectric thin-film resonator as shown in FIGS. 1A through 1C and the filter as shown in FIGS. 3A through 3C are thus produced.

The dry etching to form the cavity 17 is performed under the condition of alternately repeating an etching process with a $SF_6$ gas and a forming process of a sidewall protection film for the cavity 17. With the above-mentioned etching conditions, the cavity 17 may be formed to have a sidewall shape substantially vertical to the main surface of the silicon substrate 11.

The materials have been described above as examples for the above-mentioned substrate 11, the electrode films 12 and 14, and the piezoelectric film 13. However, conventionally and generally used materials are capable of obtaining the same effects as those of the resonator and filter in accordance with the present invention. The first adjustment film 15 is not limited to Ti. The first adjustment film 15 may be a conducting film such as a metal film or alloy film or an insulation film such as $SiO_2$, SiN, or AlN, if the part of the film can be thinner by irradiating the excitation energy for etching. The aforementioned etching method includes ion-milling, reactive ion etching, and pulse laser. In addition, the second adjustment film 16 is not necessarily $SiO_2$, as described. The second adjustment film 16 may be an alloy film or insulation film such as $SiO_2$, SiN, or AlN, if the part of the film can be thinner by irradiating the excitation energy for etching. A sacrifice layer may be used for forming the cavity 17 under the lower electrode film 12. Further, the resonator may be an SMR resonator that has an acoustic reflection film instead of the cavity 17. The acoustic reflection film having a high acoustic impedance film and a low acoustic impedance film that are alternately laminated to a film thickness of $\lambda/4$, where $\lambda$ is the wavelength of the acoustic wave.

Figure 7:
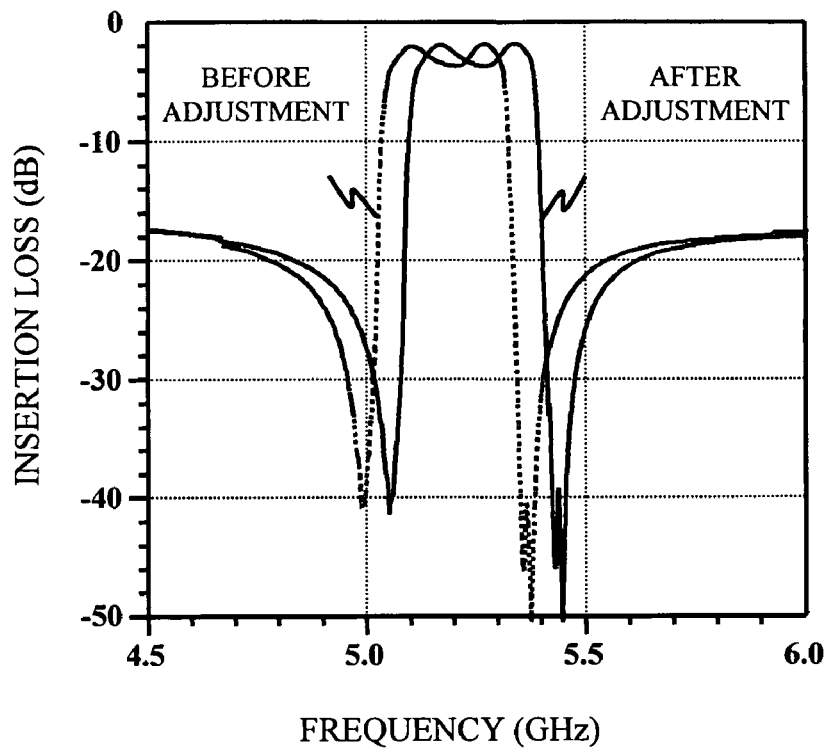
FIG. 7 is a graph showing filter characteristics before and after the adjustment of the center frequency, the filter having been produced according to the above-mentioned processes in accordance with the present invention.

FIG. 7 is a graph of filter characteristics before and after the adjustment of the center frequency, the filter having been produced according to the above-mentioned process in accordance with the present invention. The horizontal axis denotes the frequency (GHz), and the vertical axis denotes the insertion loss in the passband (the degree of suppression is represented by dB). Here, the adjustment of the center frequency is performed by dry etching the second adjustment film of $SiO_2$ and reducing the part of the second adjustment film gradually. Referring to FIG. 7, the frequency characteristics vary depending on the thickness, namely, weight, of the second adjustment film, and the center frequency can be controlled.

Figure 8:
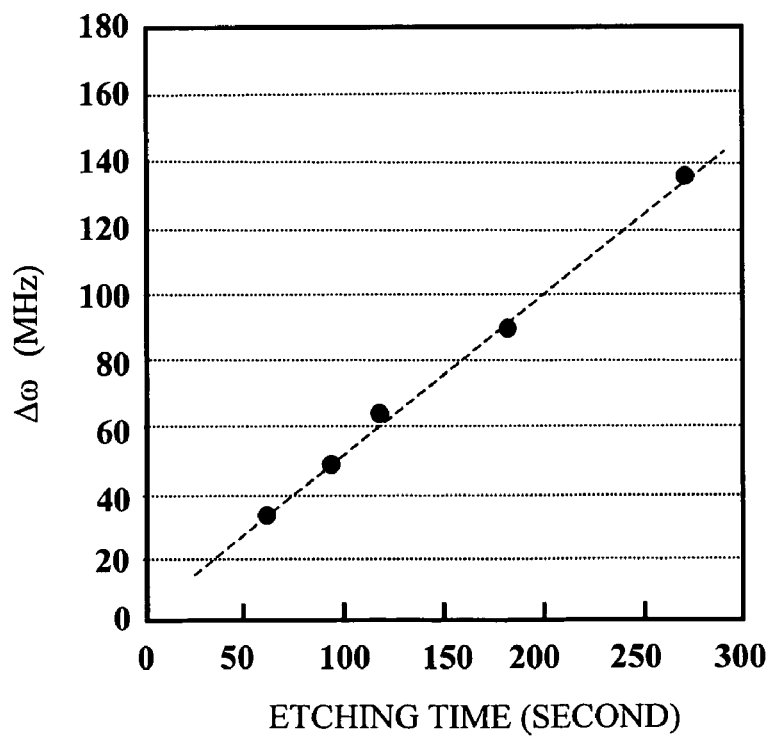
FIG. 8 is a graph showing an etching time dependency of the second adjustment film to a change amount of a filter center frequency $\Delta\omega$.

FIG. 8 is a graph of an etching-time dependency of the second adjustment film to a change amount $\Delta\omega$ of the center frequency of the filter. Referring to FIG. 8, the change amount $\Delta\omega$ of the center frequency of the filter varies substantially linearly, depending on the etching time, namely, etching amount, of the second adjustment film.

The $\Delta f$ adjustment process is thus performed for adjusting the resonant frequency of the piezoelectric thin-film resonators by controlling the thickness, namely, weight, of the first adjustment film. Then, the $\Delta\omega$ adjustment of the center frequency of the filter is carried out by controlling the weight of the second adjustment film. It is thus possible to carry out the $\Delta f$ adjustment process and the $\Delta\omega$ adjustment of the center frequency of the filter separately, and thereby correct any deviation of the center frequency without degrading the filter characteristics.

Second Embodiment

Figure 9A:
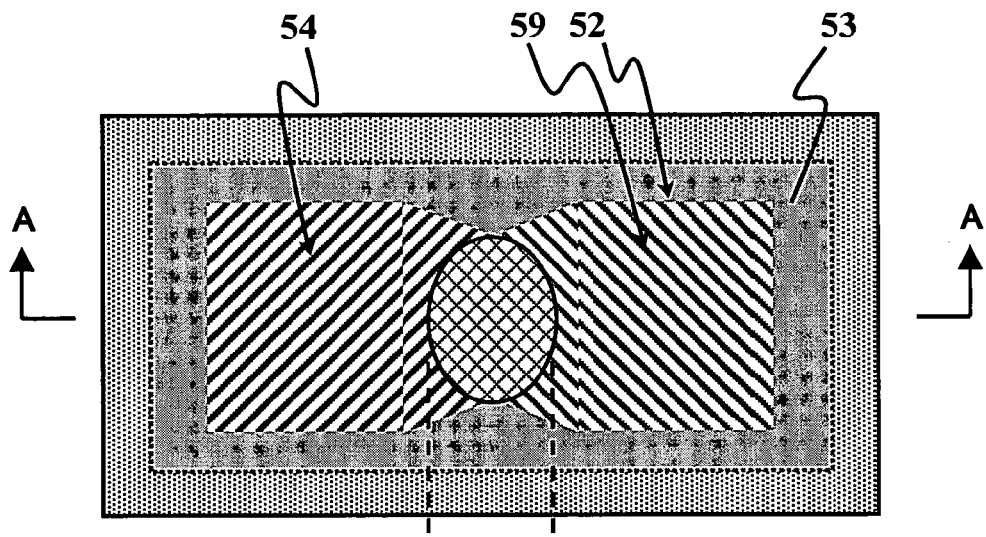
FIGS. 9A through 9C illustrate a piezoelectric thin-film resonator in accordance with a second embodiment of the present invention.
Figure 9B:
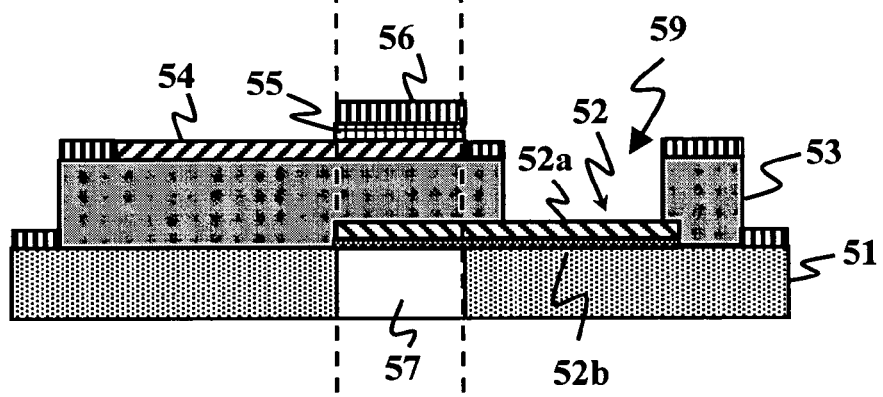
Figure 9C:
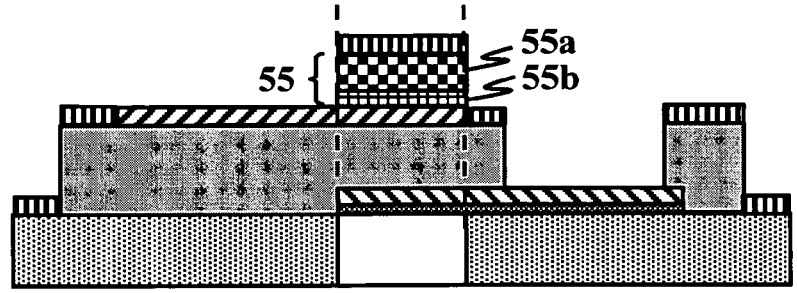

FIGS. 9A through 9C illustrate a piezoelectric thin-film resonator in accordance with a second embodiment of the present invention. FIG. 9A is a top view of the resonator, and FIGS. 9B and 9C are cross-sectional views taken along a line A-A shown in FIG. 9A. The piezoelectric thin-film resonator may be used as the series-arm resonator or parallel-arm resonator in accordance with the present invention.

The piezoelectric thin-film resonator includes a silicon substrate 51, a lower electrode film 52, a piezoelectric film 53 of AlN, and an upper electrode film 54 of Ru. The lower electrode film 52 is a two-layered structure (Ru/Cr) in which a Ru film 52a and a Cr film 52b are laminated. In the case of the series-arm resonator, a second adjustment film 56 of $SiO_2$ is provided on a Cr film 55b in a region, which faces the upper electrode film 54 and the lower electrode film 52. In the case of the parallel-arm resonator, a first adjustment film 55 is formed in the overlapping region which the upper electrode film 54 and the lower electrode film 52 face each other through the piezoelectric film 53. The first adjustment film 55 is a laminated film (Ti/Cr) of a Ti film 55a and the Cr film 55b having different etching selectivities. The second adjustment film 56 of $Sio_2$ is also provided on the substrate 51 and the piezoelectric film 53, which are not covered with the lower electrode film 52 or the upper electrode film 54. The second adjustment film 56 is made of $SiO_2$, but is not limited to $SiO_2$. A material that is hard to be oxidized may be employed such as a metal oxide other than $SiO_2$ or a metal nitride such as SiN, AlN, or the like. A contact window 59 is arranged on the piezoelectric film 53. The lower electrode film 52 is exposed via the contact window 59.

A hole 57 is provided on the backside of the substrate 51 as a cavity for confining the elastic energy, and approximately corresponds to the overlapping region in which the upper electrode film 54 and the lower electrode film 52 face. The cavity 57 is formed by the silicon substrate 51 from the backside thereof with a fluorinated gas.

For example, the the piezoelectric thin-film resonator having a frequency of 5.2 GHz has the lower electrode film 52a of Ru having a thickness of 100 nm, the Cr film 52b having a thickness of 50 nm, the piezoelectric film 53 of AlN having a thickness of 400 nm, and the upper electrode film 54 of Ru having a thickness of 100 nm.

Figure 10A:
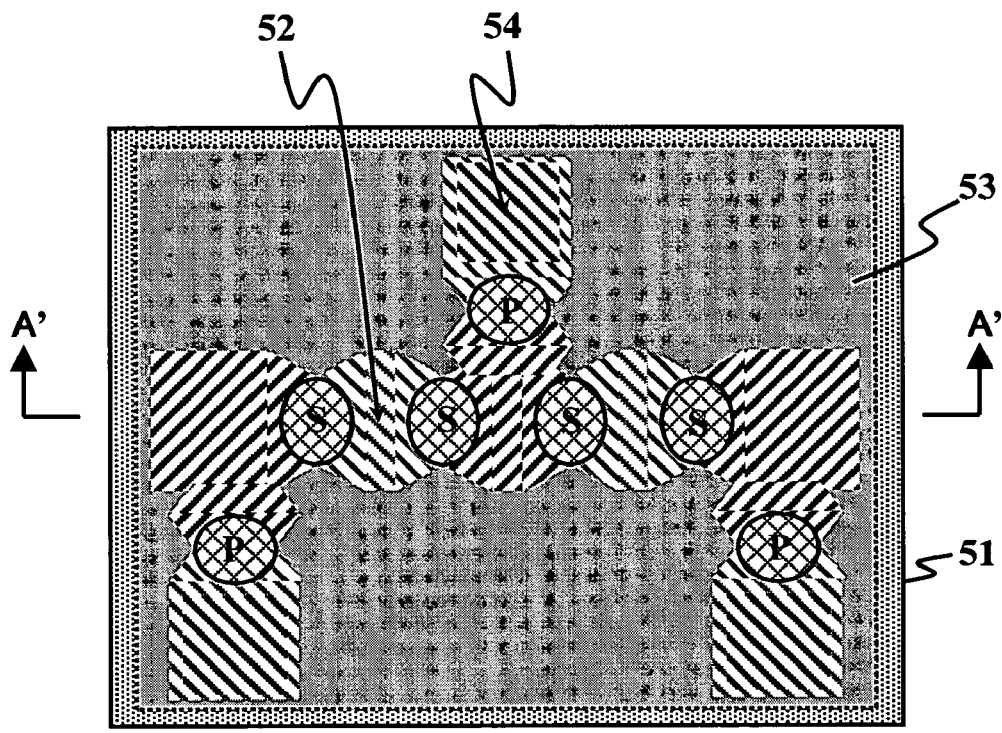
FIGS. 10A and 10B illustrate a filter in which multiple piezoelectric thin-film resonators in accordance with the present invention are connected in series-arm and parallel-arm.
Figure 10B:
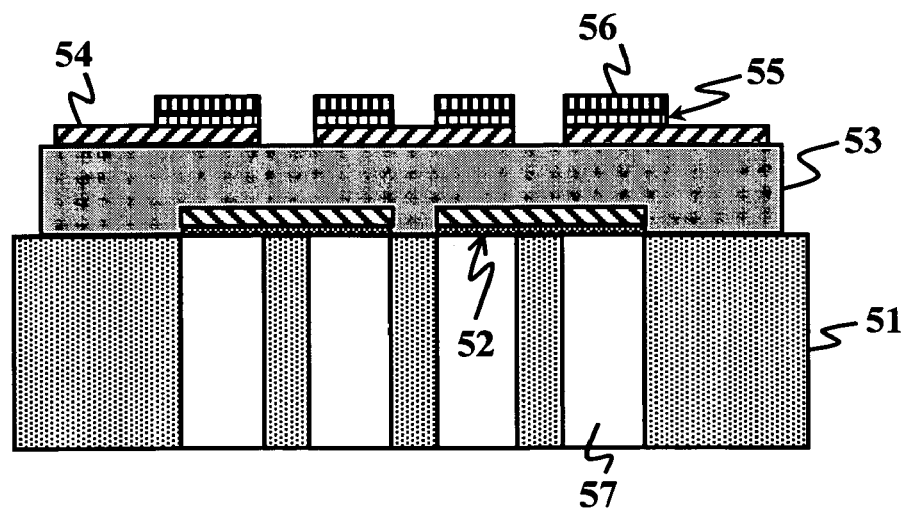

FIGS. 10A and 10B illustrate a filter in which multiple piezoelectric thin-film resonators according to the second embodiment are arranged in series arms and parallel arms. FIG. 10A is a top view of the filter, and FIG. 10B is a cross-sectional view taken along a line A'-A' shown in FIG. 10A. Referring to FIGS. 10A and 10B, the filter is made up of three parallel-arm resonators (P) and four series-arm resonators (S). The fundamental structures of these piezoelectric thin-film resonators are almost the same as those shown in FIGS. 9A through 9C. The filter that functions as a bandpass filter with the piezoelectric thin-film resonators is required to have the parallel-arm resonators with reduced resonance frequencies, which are realized by an arrangement in which the first adjustment film 55 comprises the Cr film 55b only in each series-arm resonator, and the first adjustment film 55 is made of the laminated film (Ti/Cr) of the Ti film 55a and the Cr film 55b in each parallel-arm resonator. Here, the Cr film 55b serves as an adhesion layer between the upper electrode film 54 and the second adjustment film 56.

Figure 11A:
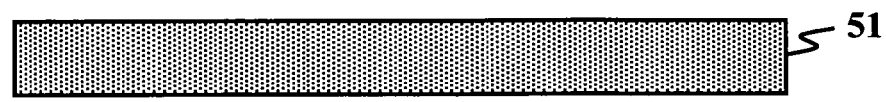
FIGS. 11A through 11E illustrate manufacturing processes of the resonator and filter in accordance with the second embodiment of the present invention.
Figure 11B:
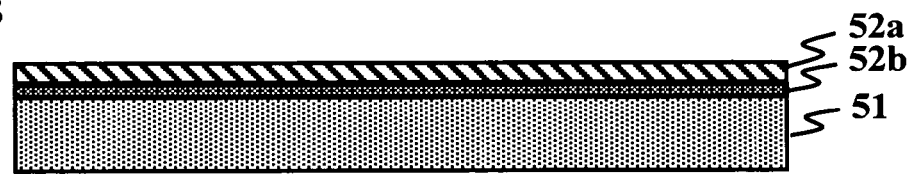
Figure 11C:
Figure 11D:
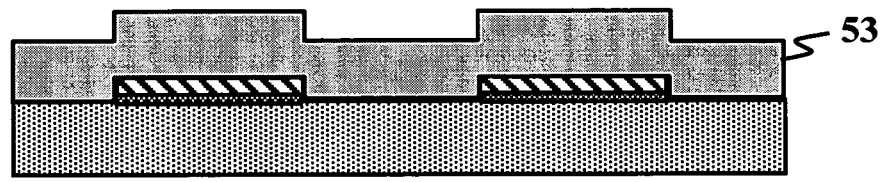
Figure 11E:
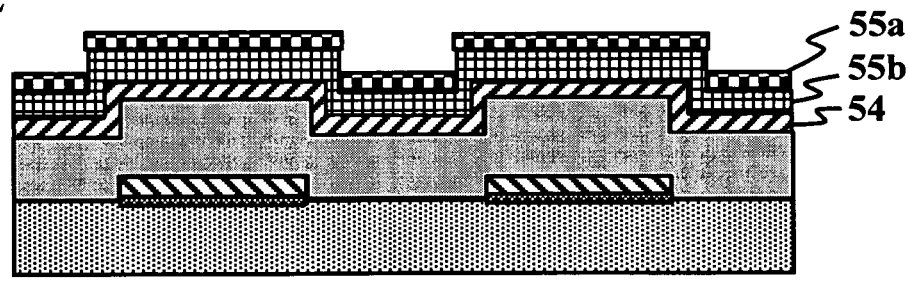

Next, a description will be given of a process of manufacturing the filter according to the second embodiment with reference to FIGS. 11A through 11E, FIGS. 12A through 12D, and FIGS. 13A through 13D. First, referring to FIGS. 11A and 11B, a film laminate of the Ru film 52a and the Cr film 52b is formed, as the lower electrode film 52 on the silicon substrate 51 having a thickness of 300 µm by sputtering. Next, as shown in FIG. 11C, the lower electrode film 52 is patterned into a desired shape with the photolithography and the wet or dry etching techniques. As shown in FIG. 11D, an AlN thin film serving as the piezoelectric film 53 is grown. As shown in FIG. 11E, a Ru film for the upper electrode film 54 by sputtering, and then a Ti film for the first adjustment film 55 is grown by sputtering.

Figure 12A:
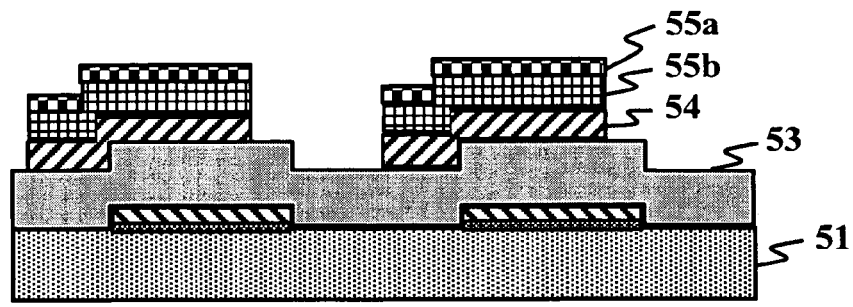
FIGS. 12A through 12D illustrate manufacturing processes of the resonator and filter in accordance with the second embodiment of the present invention.

Next, referring to FIG. 12A, the first adjustment film 55 and the upper electrode film 54 are patterned into desired shapes by the photolithography and wet or dry etching techniques. The first adjustment film 55 and the upper electrode film 54 may be patterned by lift off.

Figure 12B:
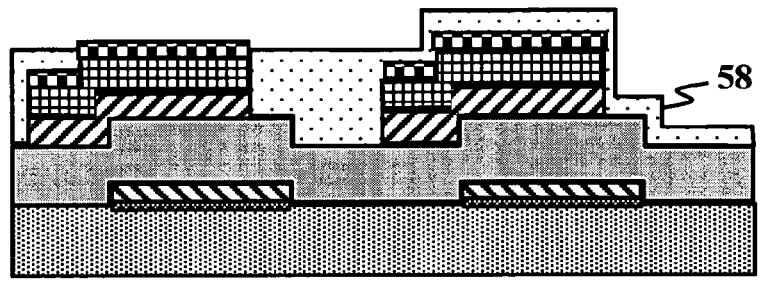
Figure 12C:
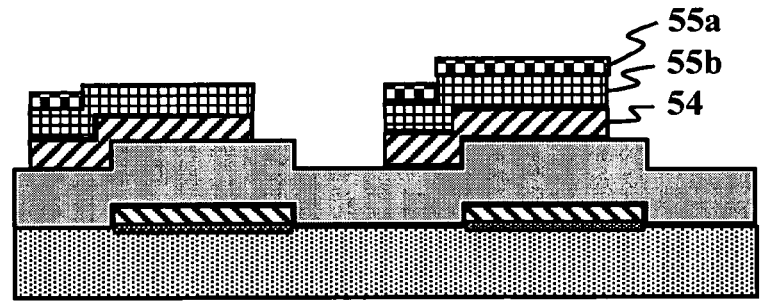

As shown in FIG. 12B, the first adjustment film 55 is partially masked with a resist 58 by using the photolithography technique. As shown in FIG. 12C, the Ti film 55a of the first adjustment film 55 is partly dry etched so as to be thinner while the Cr film 55b of the first adjustment layer 55 remains completely. In this manner, the thickness of a part of the first adjustment film 55 is reduced. The remaining Cr film 55b additionally serves as an adhesion layer between the upper electrode film 54 and the second adjustment layer 56. The process of patterning the first adjustment film 55 and the upper electrode film 54 and the process for partly reducing the first adjustment film 55 may be performed in reverse order from that described above. In addition, the Ti film 55a and the Cr film 55b may be laminated in reverse order to employ the Cr/Ti layer structure. Further, the material of the first adjustment film 55 is not limited to Ti or Cr, and may employ two films having the etching selectivity such as a conducting film and an insulation film, for example, $SiO_2$, SiN, or AlN.

Figure 12D:
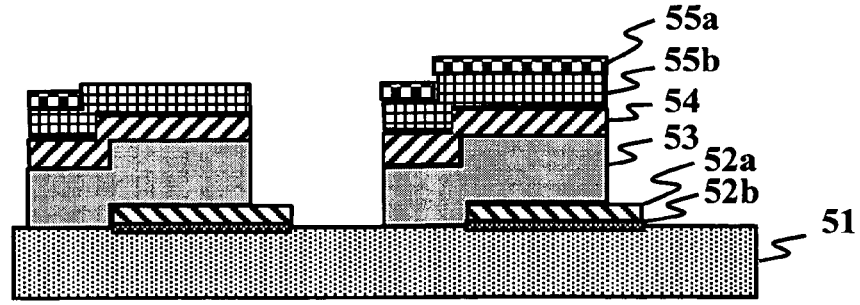
Figure 13A:
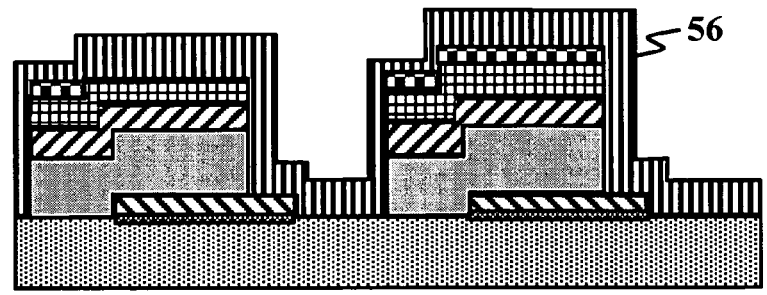
FIGS. 13A through 13D illustrate manufacturing processes of the resonator and filter in accordance with the second embodiment of the present invention.
Figure 13B:
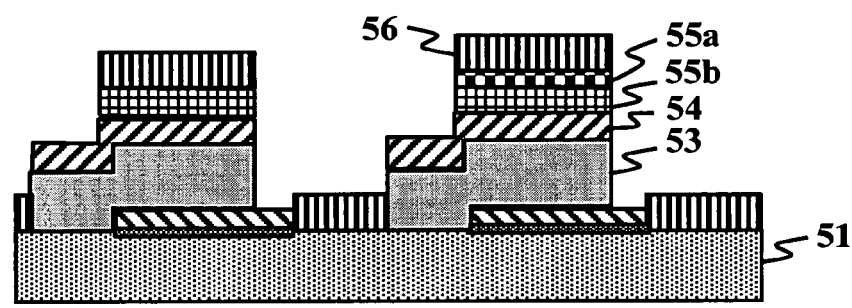

Next, referring to FIG. 12D, the piezoelectric film 53 is patterned to have a desired shape by the photolithography and wet or dry etching techniques. Referring to FIGS. 13A and 13B, the second adjustment film 56 of $SiO_2$ is formed with sputtering, an unnecessary part in the first adjustment film 55 and the second adjustment film 56 provided on the upper electrode film 54 are removed so that bump pads, not shown, may be formed thereon. Here, the second adjustment film 56 is not limited to $SiO_2$ but may be an insulation film such as $SiO_2$, SiN, or AlN, if a part of the film can be thinner by irradiating the excitation energy for etching.

Figure 13C:
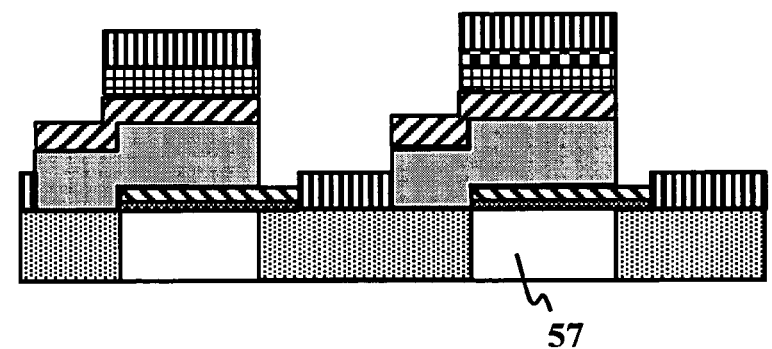
Figure 13D:
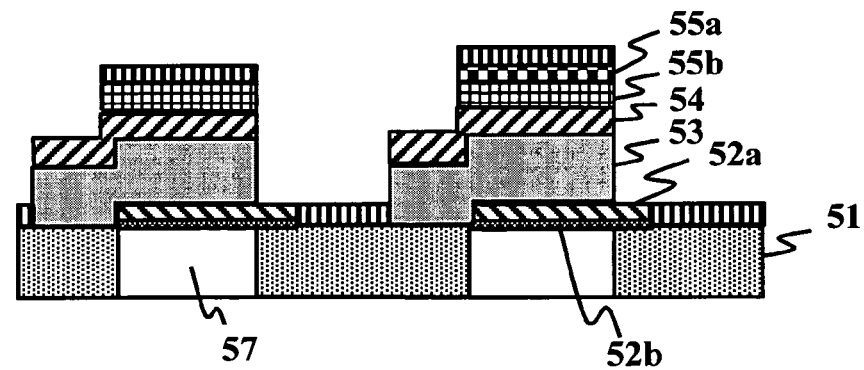

Finally, referring to FIG. 13C, the resist for dry etching is patterned on the backside of the silicon substrate 51 with the photolithography technique to provide the cavity 57. The cavity 57 is arranged on the backside of the substrate 51 so as to correspond to the overlapping region in which the upper electrode film 54 and the lower electrode film 52 face through the piezoelectric film 53. Referring to FIG. 13D, the piezoelectric thin-film resonator as shown in FIGS. 9A through 9C and the filter as shown in FIGS. 9A through 9C are produced.

The dry etching to form the cavity 57 is performed under the condition of alternately repeating the etching process with a $SF_6$ gas and the forming process of the sidewall protection film for the cavity 57. With the above-mentioned etching conditions, the cavity 57 can be formed to have a sidewall shape substantially vertical to the main surface of the silicon substrate 11.

Some materials have been described above as examples for the above-mentioned substrate 51, the electrode films 52 and 54, and the piezoelectric film 53. The sacrifice layer may be used for forming the cavity 57 under the lower electrode film 52. Further, instead of the cavity 57, a high acoustic impedance film and a low acoustic impedance film are alternately laminated to a film thickness of $\lambda/4$, where $\lambda$ is the wavelength of the acoustic wave.

With the manufacturing processes in accordance with the second embodiment of the present invention, the displacement amount of the resonance frequency can be controlled by the thickness of the Ti film 55a in the first adjustment film 55. With this method, it is possible to adjust the resonance frequency highly accurately as compared to the conventionally used control method of etching the electrode film and to thereby enhance the adhesion of the upper electrode film 54 and the second adjustment film 56. Thus, the filter characteristics are also improved. Further, the center frequency of the filter is controlled by the thickness, namely, the weight, of the second adjustment film having a different material from that of the first adjustment film 55. It is thus possible to control the center frequency stably.

Third Embodiment

Figure 14A:
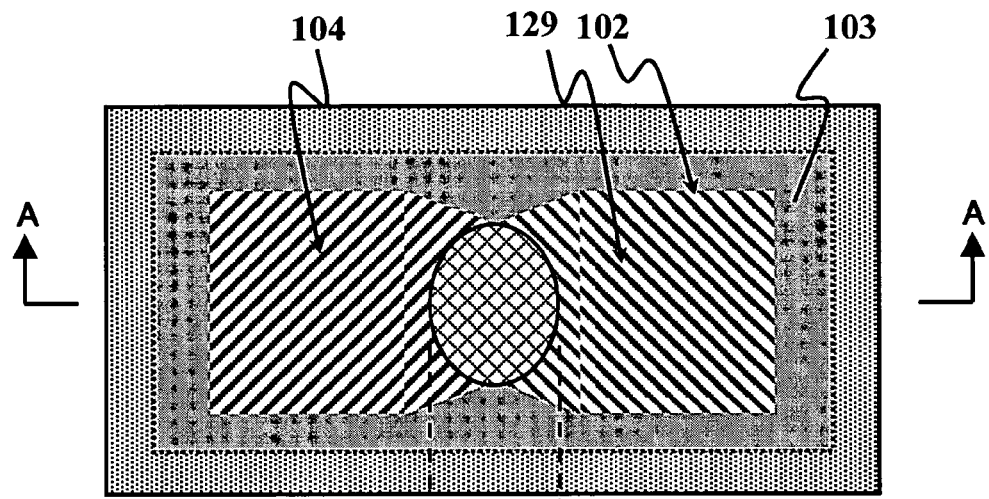
FIGS. 14A through 14C illustrate a piezoelectric thin-film resonator in accordance with a third embodiment of the present invention.
Figure 14B:
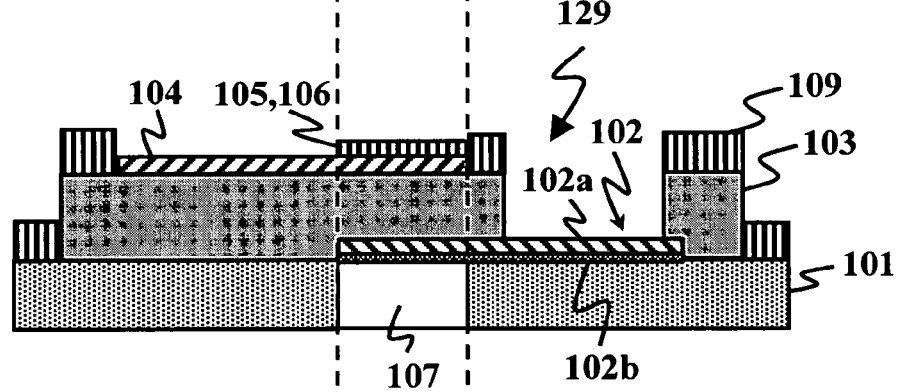
Figure 14C:
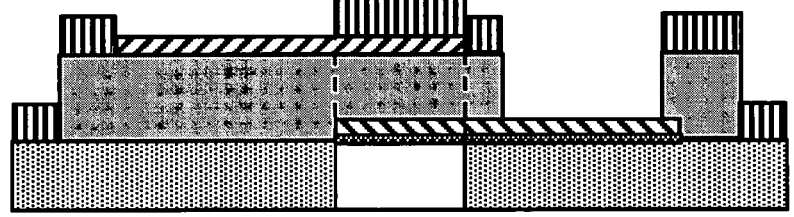

FIGS. 14A through 14C illustrate a piezoelectric thin-film resonator in accordance with a third embodiment of the present invention. FIG. 14A is a top view of the resonator, and FIGS. 14B and 14C are cross-sectional views taken along a line A-A shown in FIG. 14A. The piezoelectric thin-film resonator in the present embodiment may be used as a series-arm resonator or parallel-arm resonator.

The piezoelectric thin-film resonator includes a silicon substrate 101, a lower electrode film 102, a piezoelectric film 103 of AlN, and an upper electrode film 104 of Ru. The lower electrode film 102 is a two-layered structure (Ru/Cr) in which a Ru film 102a and a Cr film 102b are laminated. A first adjustment film 105 of $SiO_2$ is provided in an overlapping region in which the upper electrode film 104 and the lower electrode film 102 face through the piezoelectric film 103. A second adjustment film 106 of $SiO_2$ is provided on the first adjustment film 105. That is to say, both of the first adjustment film 105 and the second adjustment film 106 are made of $SiO_2$. In the following description, sometimes, the first and second adjustment layers 105 and 106 are simply referred to as a frequency adjustment film 109. The lower electrode film 102 is exposed via a contact window 129 formed in the piezoelectric film 103.

The frequency adjustment film 109 is also formed on surfaces of the substrate 101 and the piezoelectric film 103, which are not covered with the lower electrode film 102 and the upper electrode film 104. A cavity 107 is formed in the substrate 101 for confining the elastic energy, and approximately corresponds to an overlapping region in which the upper electrode film 104 and the lower electrode film 102 face each other through the piezoelectric film 103. The cavity 107 is formed by the silicon substrate 101 from the backside thereof with a fluorinated gas.

For example, the piezoelectric thin-film resonator that has a frequency of 5.2 GHz has the lower electrode film 102a of Ru having a thickness of 100 nm, the Cr film 102b having a thickness of 50 nm, the piezoelectric film 103 of AlN having a thickness of 400 nm, and the upper electrode film 104 of Ru having a thickness of 100 nm.

Figure 15A:
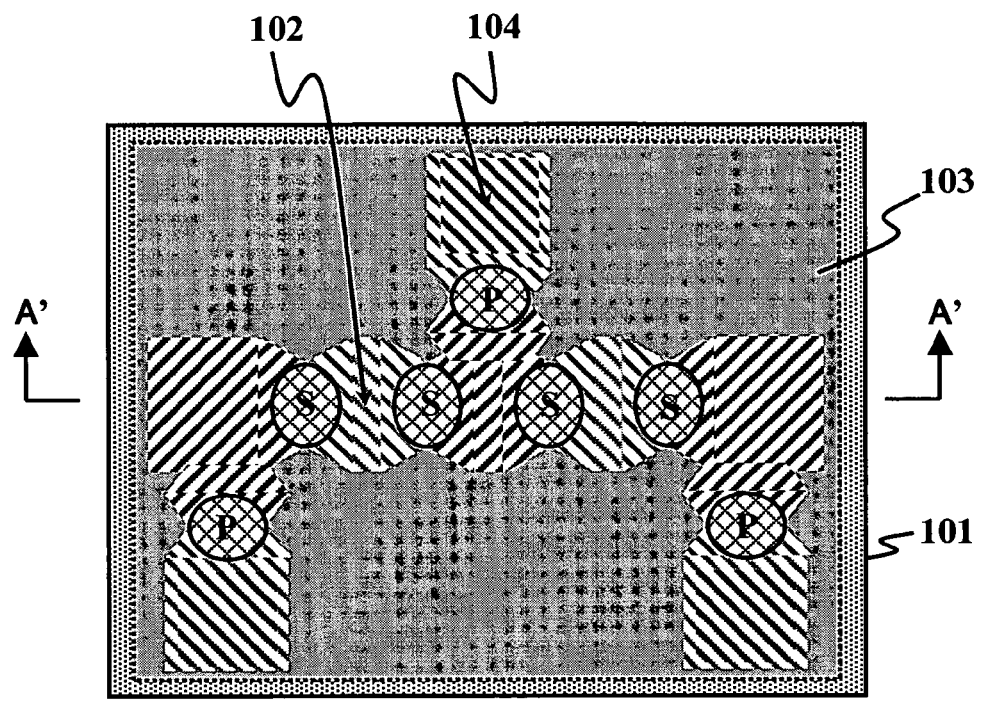
FIGS. 15A and 15B illustrate a filter in which multiple piezoelectric thin-film resonators in accordance with the third embodiment of the present invention are connected in series-arm and parallel-arm.
Figure 15B:
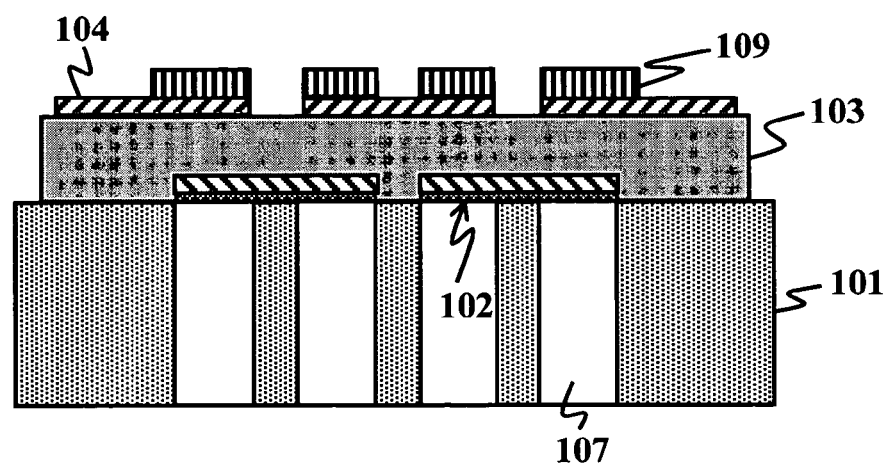

FIGS. 15A and 15B illustrate a filter in which multiple piezoelectric thin-film resonators in accordance with the third embodiment of the present invention are provided in series arms and parallel arms. FIG. 15A is a top view of the filter. FIG. 15B is a cross-sectional view taken along a line A'-A' shown in FIG. 15A. As shown in FIGS. 15A and 15B, the filter has three parallel-arm resonators (P) and four series-arm resonators (S). The fundamental structures of these piezoelectric thin-film resonators are almost the same as that shown in FIGS. 14A through 14C. The filter that functions as a bandpass filter with the case where the piezoelectric thin-film resonators is required to have the parallel-arm resonators having reduced resonance frequencies, that are realized by an arrangement in which the frequency adjustment films 109 in the parallel-arm resonators are made thicker than those in the series-arm resonators to become heavier. A thin film, not shown, may be arranged between the upper electrode film 104 and the frequency adjustment film 109.

Figure 16A:
FIGS. 16A through 16E illustrate manufacturing processes of the resonator and filter in accordance with the third embodiment of the present invention.
Figure 16B:
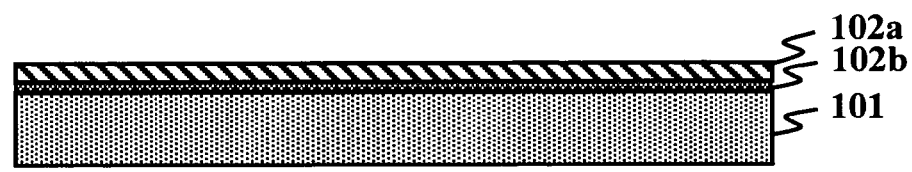
Figure 16C:
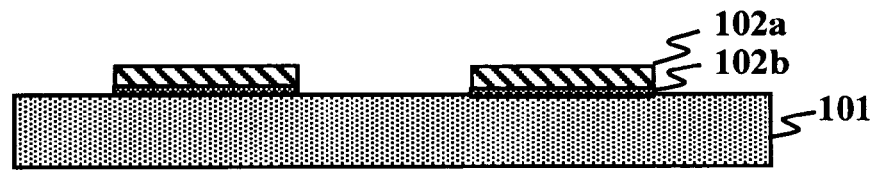
Figure 16D:
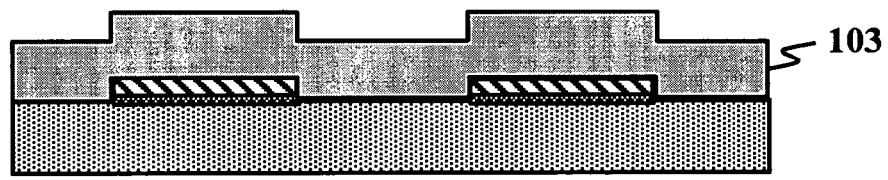
Figure 16E:
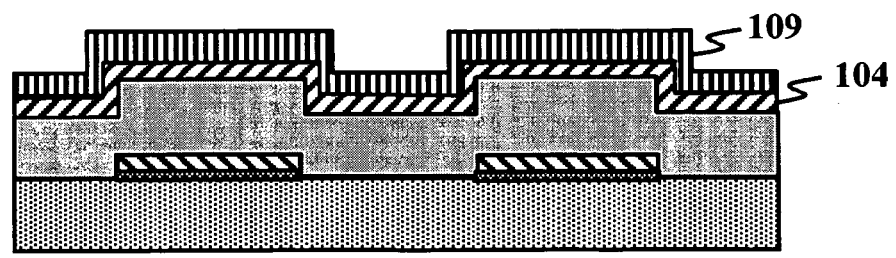
Figure 18A:
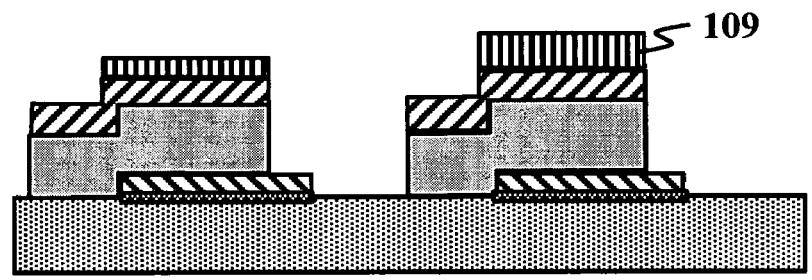
FIGS. 18A through 18C illustrate manufacturing processes of the resonator and filter in accordance with the third embodiment of the present invention.

Now, a description will be given of a process of fabricating the filter with reference to FIGS. 16A through 16E, Figs, 17A through 17D, and FIGS. 18A through 18C. First, referring to FIGS. 16A and 16B, the laminated film of the Ru film 102a and the Cr film 102b is provided, as the lower electrode film 102, on the silicon substrate 101 having a thickness of 300μm by sputtering. Next, as shown in FIG. 16C, the lower electrode film 102 is patterned into a desired shape with the photolithography and the wet or dry etching techniques. Then, as shown in FIG. 16D, an AlN thin film serving as the piezoelectric film 103 is grown. After that, as shown in FIG. 16E, the frequency adjustment layer 109 is formed by forming a Ru film for the upper electrode film 104 by sputtering, and then forming an $SiO_2$ film for the first adjustment film 105 and the second adjustment film 106 by sputtering. Here, a thin film may be arranged between the upper electrode film 104 and the frequency adjustment film 109 to improve the adhesion therebetween.

Figure 17A:
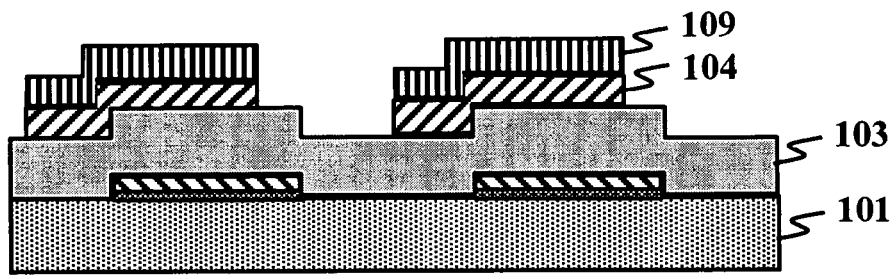
FIGS. 17A through 17D illustrate manufacturing processes of the resonator and filter in accordance with the third embodiment of the present invention.

Next, as shown in FIG. 17A, the frequency adjustment film 109 and the upper electrode film 104 are patterned into desired shapes by the photolithography and wet or dry etching techniques. The frequency adjustment film 109 and the upper electrode film 104 may be patterned by lift off.

Figure 17B:
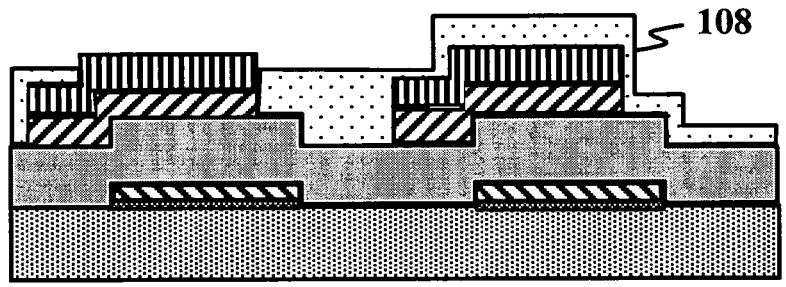
Figure 17C:
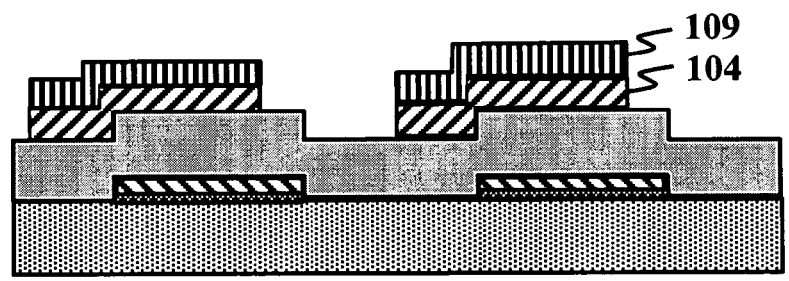

Then, as shown in FIG. 17B, the frequency adjustment film 109 is partially masked with a resist 108 by the photolithography technique. Referring to FIG. 17C, the frequency adjustment film 109 of $SiO_2$ is partly removed by wet or dry etching so as to have a portion having a reduced thickness. The patterning process of the frequency adjustment film 109 and the upper electrode film 104 and the process for partly reducing the thickness of the frequency adjustment film 109 may be performed in reverse order from that described above.

Figure 17D:
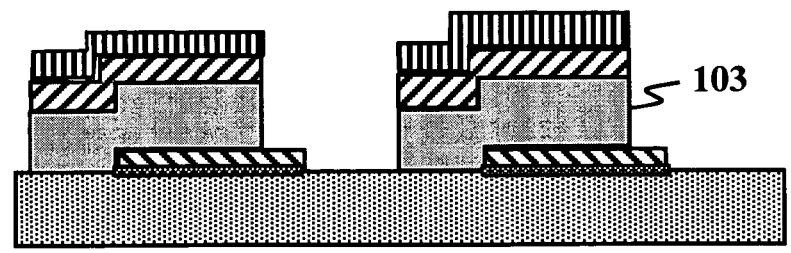

Next, referring to FIG. 17D, the piezoelectric film 103 is patterned to have a desired shape by the photolithography and wet or dry etching techniques. Referring to FIG. 18A, an unnecessary part in the frequency adjustment film 109 provided on the upper electrode film 104 is removed so that bump pads, not shown, may be formed thereon.

Figure 18B:
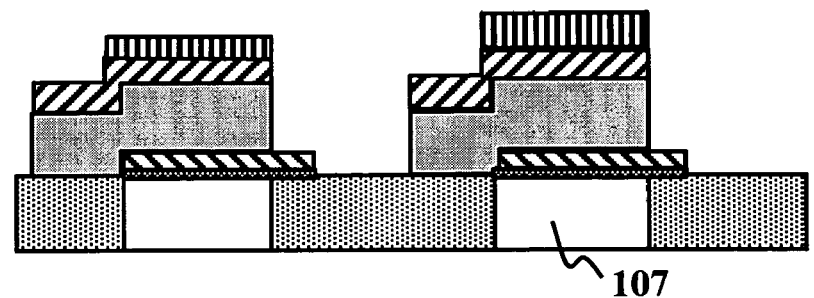
Figure 18C:
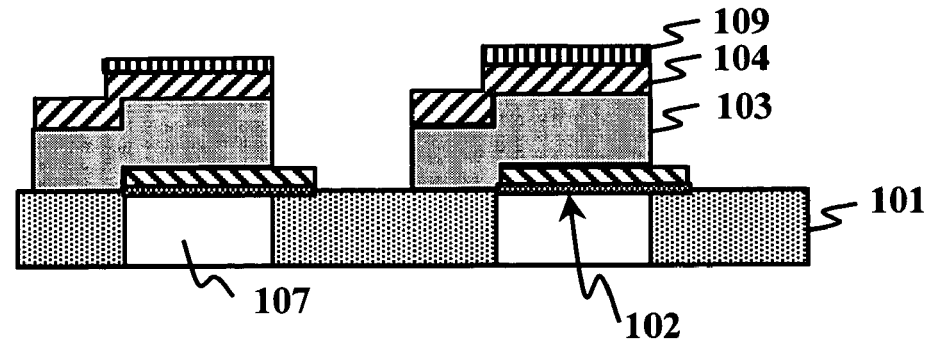

Finally, referring to FIG. 18B, the resist for dry etching is patterned on the backside of the silicon substrate 101 with the photolithography technique in order to form the cavity 107. The cavity 107 is arranged on the backside of the substrate 101 so as to correspond to the overlapping region in which the upper electrode film 104 and the lower electrode film 102 face through the piezoelectric film 103. In the above-mentioned manner, as shown in FIG. 18C, the piezoelectric thin-film resonator as shown in FIGS. 14A through 14C and the filter as shown in FIGS. 15A and 15B are produced.

The dry etching to form the cavity 107 is performed under the condition of alternately repeating the etching process with the $SF_6$ gas and a forming process of a sidewall protection film for the cavity 107. With the above-mentioned etching conditions, the cavity 107 can be formed to have a sidewall shape substantially vertical to the main surface of the silicon substrate 101.

Some materials have been described above as examples for the above-mentioned substrate 101, the electrode films 102 and 104, and the piezoelectric film 103. The material of the frequency adjustment film 109 may not be limited to $SiO_2$, and may be a material that is difficult to be oxidized such as oxide or nitride, for example, SiN or AlN. The sacrifice layer may be used for forming the cavity 107 under the lower electrode film 102. Further, instead of the cavity 107, the high acoustic impedance film and the low acoustic impedance film are alternately laminated to a film thickness of $\lambda/4$ where $\lambda$ is the wavelength of the acoustic wave.

As described above, the resonator in accordance with the present invention includes the frequency adjustment film having the two-layered structure. The first adjustment film is used for $\Delta f$ adjustment, and the second adjustment film is used for correcting frequency deviations caused in the filter manufacturing process. The $\Delta f$ adjustment process and the adjustment of the center frequency of the filter can be controlled separately and independently, by providing the above-mentioned two frequency adjustment films in advance, and thereby it is possible to fabricate the piezoelectric thin-film resonators having different frequencies on a single substrate or wafer. Also, it is possible to accurately control the center frequency of the filter in which the multiple resonators are connected.

The above-mentioned second adjustment film is an insulation film made of a material difficult to be oxidized, for example, oxide or nitride. In addition, the second adjustment film is made of a different material from that of the upper electrode film. By selecting these materials, it is possible to suppress the degradation of the resonance characteristics and adverse affects due to oxidization of the upper electrode film surface in the $\Delta f$ adjustment process and to suppress the adverse affects to the center frequency adjustment process of the filter due to the degradation of the resonance frequency characteristics. Further, it is possible to avoid degradation of the yield resulting from the degradation of adhesiveness with a conductive lower layer for a bump or connecting a wire.

In accordance with the present invention, it is possible to achieve perform the precise $\Delta f$ adjustment of the piezoelectric thin-film resonators fabricated on the single substrate or wafer. Also, it is possible to accurately control the center frequency of the filter having multiple piezoelectric thin-film resonators.

The filter of the present invention is not limited to a filter having a single passband, but includes a duplexer or a dual band filter having multiple passbands. For example, the duplexer may be connected to an antenna to separate a transmission signal and a reception signal existing close to each other. The duplexer may include a transmission filter and a reception filter, both of which may be composed of a single substrate or respective substrates. The transmission filter and the reception filter respectively include multiple resonators connected in ladders, and have adjacent transmission signal passband the reception signal passband.

The present invention is not limited to the above-mentioned embodiments, and other embodiments, variations and modifications may be made without departing from the scope of the present invention.

The present invention is based on Japanese Patent Application No. 2004-101878 filed on Mar. 31, 2004, the entire disclosure of which is hereby incorporated by reference.

What is claimed is:

1. A filter having a series-arm resonator and a parallel-arm resonator, in which each of the resonators includes a common substrate, a common piezoelectric thin film having a first surface on which a first electrode film is formed and a second surface on which a second electrode film is formed, and a frequency adjustment film provided on the second electrode film, wherein:

the frequency adjustment films of the series-arm and parallel-arm resonators are partially provided on the second electrode film and are located in only overlapping regions in which the first and second electrodes overlap with each other across the piezoelectric thin film; and the first electrodes of the series-arm and parallel-arm resonators facing cavities formed below the overlapping regions of the series-arm and parallel-arm resonators.

2. The filter as claimed in claim 1, wherein:

the frequency adjustment film of the series-arm resonator has a single-layer structure; and the frequency adjustment film of the parallel-arm resonator has a two-layer structure.

3. A method of fabricating a filter having a series-arm resonator and a parallel-arm resonator comprising:

forming a first electrode film on a first surface of the piezoelectric thin-film on a main surface of a substrate, a second electrode film on a second surface of the piezoelectric thin-film, and partially forming a first frequency adjustment film on one of the first and second electrode films;

adjusting a thickness of a portion of the first frequency adjustment film to adjust a first resonance frequency of the piezoelectric thin-film;

forming a second frequency adjustment film on the first frequency adjustment film; and adjusting a thickness of a region of the second frequency adjustment film to adjust a second resonance frequency of the piezoelectric thin-film, the first and second frequency adjustment films being provided in only overlapping regions in which the first and second electrodes overlap with each other across the piezoelectric thin film, the first electrodes of the series-arm and parallel-arm resonators facing cavities formed below the overlapping regions of the series-arm and parallel-arm resonators.

4. The method as claimed in claim 3, wherein: the series-arm resonator has only the first frequency adjustment film; and the parallel-arm resonator has the first and second frequency adjustment films.

* * * * *